United States Patent
Evans et al.

(10) Patent No.: US 10,269,663 B2
(45) Date of Patent: Apr. 23, 2019

(54) CRITICAL DIMENSIONS VARIANCE COMPENSATION

(71) Applicant: Varian Semiconductor Equipment Associates, Inc., Gloucester, MA (US)

(72) Inventors: Morgan D. Evans, Manchester, MA (US); Tristan Ma, Lexington, MA (US); Kevin Anglin, Somerville, MA (US); Motoya Okazaki, San Jose, CA (US); Johannes M. van Meer, Middleton, MA (US)

(73) Assignee: VARIAN SEMICONDUCTOR EQUIPMENT ASSOCIATES, INC., Gloucester, MA (US)

(*) Notice: Subject to any disclaimer, the term of this patent is extended or adjusted under 35 U.S.C. 154(b) by 2 days.

(21) Appl. No.: 15/400,657

(22) Filed: Jan. 6, 2017

(65) Prior Publication Data
US 2018/0197796 A1    Jul. 12, 2018

(51) Int. Cl.
*H01L 21/66* (2006.01)
*H01J 37/32* (2006.01)

(52) U.S. Cl.
CPC ........ *H01L 22/26* (2013.01); *H01J 37/32009* (2013.01); *H01J 2237/32* (2013.01); *H01L 22/24* (2013.01)

(58) Field of Classification Search
CPC ..... H01L 22/24; H01L 22/26; H01L 21/3065; H01J 37/32926; H01J 37/32935; H01J 2237/32; H01J 37/32009; G03F 7/70633; G03F 17/5009

USPC ...... 438/5, 7, 11, 14, 719; 430/30, 322, 394; 216/99
See application file for complete search history.

(56) References Cited

U.S. PATENT DOCUMENTS

| | | | |
|---|---|---|---|
| 2016/0217233 A1* | 7/2016 | Kamon | G06F 17/5068 |
| 2017/0031248 A1* | 2/2017 | Hu | G03F 7/70633 |
| 2017/0363950 A1* | 12/2017 | Sriraman | G03F 1/36 |

OTHER PUBLICATIONS

Michael Orshansky, Characterization of Spatial Intrafield Gate CD Variability, Its Impact on Circuit Performance, and Spatial Mask-Level Correction, IEEE Transactions on Semiconductor Manufacturing, Feb. 2004, pp. 2-11, vol. 17, No. 1.

* cited by examiner

*Primary Examiner* — Lan Vinh

(57) ABSTRACT

An apparatus of a wafer processing apparatus includes at least one memory and logic, at least a portion of which is implemented in circuitry of the wafer processing apparatus including at least one processor coupled to the at least one memory. The logic may provide a 3D model of a surface of a wafer, the wafer defining a wafer plane; and modify a surface feature in a Z-direction along the surface of the wafer based on at least one of: an X-critical dimension (CD) extending along an X-direction of the wafer plane, and a Y-CD extending along a Y direction of the wafer plane.

9 Claims, 3 Drawing Sheets

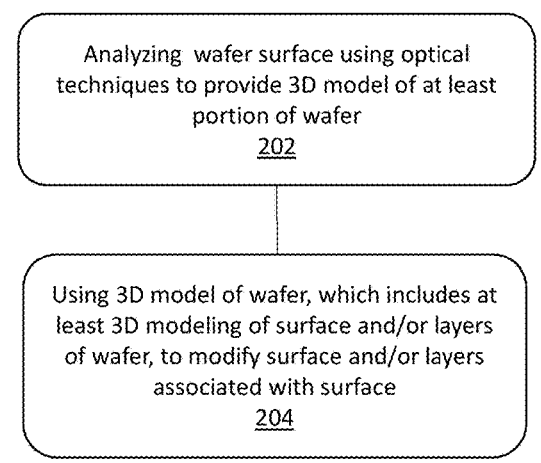
FIG. 2
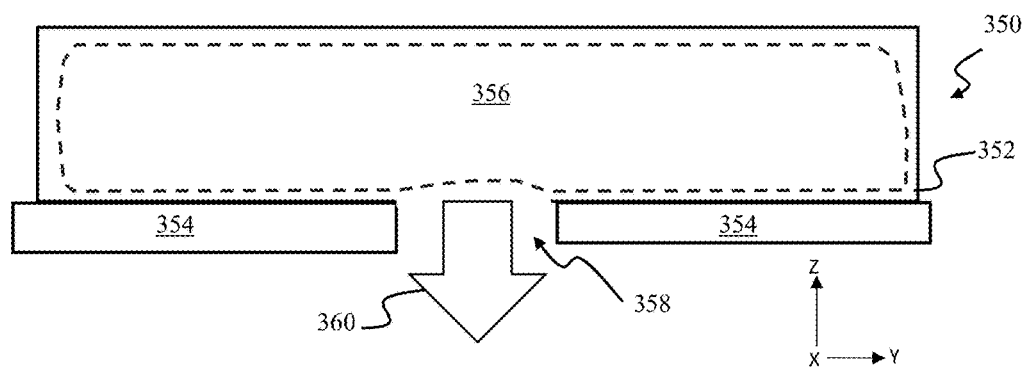
FIG. 3A
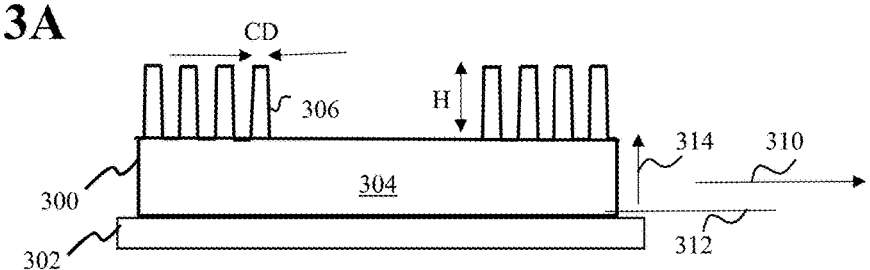

FIG. 3B   FIG. 3C

CRITICAL DIMENSIONS VARIANCE COMPENSATION

FIELD

The present embodiments relate to processing apparatus and methods, and more particularly, to components and methods compensate for critical dimensions (CDs) variations associated with a wafer.

BACKGROUND

In the integrated circuit (IC) industry today, billions of semiconductor devices are built on a single substrate, generally referred to as a wafer. The current demands for high density and performance associated with ultra large scale integration entail the use of submicron features, increased transistor and circuit speeds and improved reliability.

In the course of IC evolution, functional density (i.e., the number of interconnected devices per wafer area) has generally increased while geometry size (i.e., the smallest component that can be created using a fabrication process) has decreased. This scaling down process generally provides benefits by increasing production efficiency and lowering associated costs. However, such scaling down introduces challenges in maintaining process variations at acceptable levels within a wafer, wafer to wafer (WtW), and lot to lot. For example, as process geometries continue to decrease, critical dimension (CD) of features of a wafer are becoming continually smaller, and variations in the CD across the wafer are increasing. The "CD" may refer to the smallest dimension of a feature along a given direction, such as a transistor gate width or a line width of other type of device feature. As CD variation increases, variation of performance characteristics of devices of the wafer also increase. For example, performance characteristics of transistors of a wafer, such as saturation drain current and threshold voltage, fluctuate with the CD variation of transistor features of a wafer, such as gate widths, spacer widths, other features of the transistors, or combinations thereof. The fluctuating performance characteristics of the transistors can lead to poor device performance and low yield.

In part because of the scaling down process described in the foregoing, inspection and measurement of surface features has become more important. Some features have especially important effects on final product function, performance, or reliability, and so their dimensions (e.g., CDs) are to be carefully controlled. Deviations of a feature's CD and cross-sectional shape, e.g., profile, from design dimensions may adversely affect the performance of the finished semiconductor device.

Therefore, there is an ongoing need to improve CDs associated with a wafer and CDs WtW.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

In one embodiment, an apparatus of a wafer processing apparatus includes at least one memory and logic, at least a portion of which is implemented in circuitry of a wafer processing apparatus including at least one processor coupled to the at least one memory. The logic may: provide a 3D model of a surface of a wafer, the wafer defining a wafer plane; and modify a surface feature in a Z-direction along the surface of the wafer based on at least one of: an X-critical dimension (CD), extending along an X-direction of the wafer plane, and a Y-CD extending along a Y direction of the wafer plane.

In another embodiment, at least one machine-readable storage medium includes instructions that when executed by a computing device, cause the computing device to: provide a 3D model of a surface of a wafer, the wafer defining a wafer plane. The instructions may also modify a surface feature in a Z-direction along the surface of the wafer based on at least one of: an X-critical dimension (CD), extending along an X-direction of the wafer plane, and a Y-CD extending along a Y direction of the wafer plane. The instructions may modify a surface feature in a Z-direction along the surface of the wafer based on a surface feature in a Z-direction.

In a further embodiment, a method may include receiving a map of a critical dimension (CD) of a surface feature of a wafer as a function of X-Y-location. The wafer may comprise a wafer plane lying parallel to an X, Y plane, where the map comprises a non-uniformity in CD along a Y direction within the wafer plane. The method may also include calculating a property map comprising a value of a material property for the surface feature along a Z direction as a function of the X,Y location to compensate for the non-uniformity in CD along the Y direction, where the Z-direction is perpendicular to the wafer plane. The method may further include sending instructions to a processing apparatus to change the material property of the surface feature according to the property map.

BRIEF DESCRIPTION OF THE DRAWINGS

FIG. 2 depicts an exemplary process flow according to an embodiment of the disclosure;

FIGS. 3A-3C depict details of non-uniform wafer processing according to some embodiments of the disclosure.

DETAILED DESCRIPTION

Figure 1:
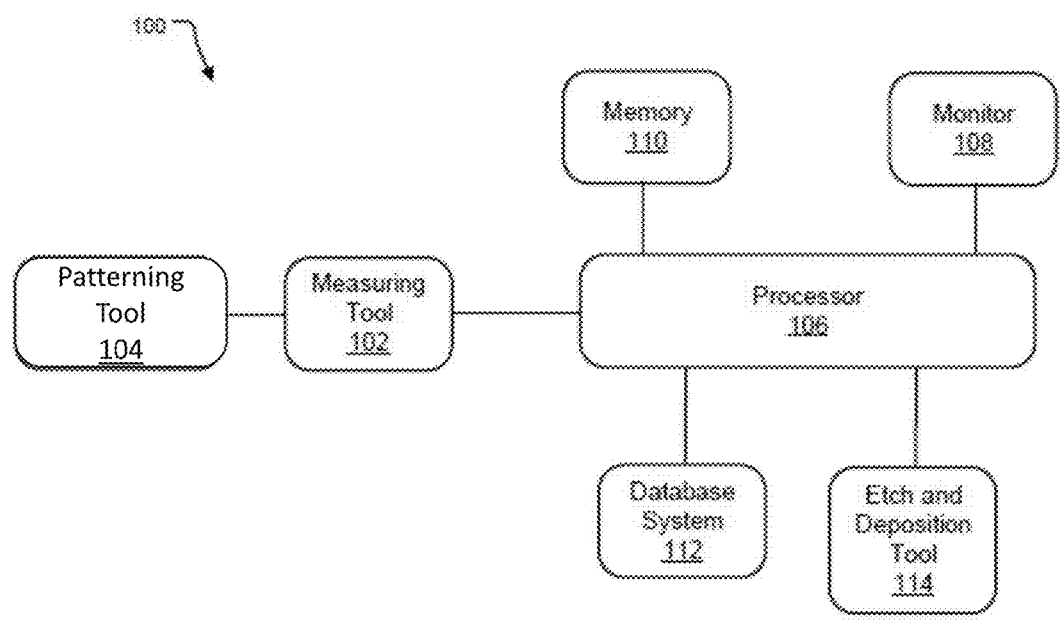
FIG. 1 illustrates a processing apparatus consistent with various embodiments of the disclosure.

The present embodiments will now be described more fully hereinafter with reference to the accompanying drawings, where some embodiments are shown. The subject matter of the present disclosure, may be embodied in many different forms and are not to be construed as limited to the embodiments set forth herein. Instead, these embodiments are provided so this disclosure will be thorough and complete, and will fully convey the scope of the subject matter to those skilled in the art. In the drawings, like numbers refer to like elements throughout.

The embodiments described herein provide an apparatus of a wafer processing apparatus that includes at least one memory and logic, at least a portion of which is implemented in circuitry of a wafer processing apparatus including one or more processors coupled to the at least one memory. The logic may: provide a 3D model of a surface associated with a wafer; and modify at least a portion of the surface in a z dimension of the surface based on one or more x and y critical dimensions (CDs) associated with the wafer.

The embodiments described herein further provide a machine-readable storage medium that when executed provide a 3D model of a surface associated with a wafer; and modify at least a portion of the surface in a z dimension of the surface based on one or more X and Y critical dimensions (CDs) associated with the wafer.

FIG. 1 illustrates a wafer processing apparatus 100 consistent with various embodiments of the disclosure. A measuring tool 102, e.g., an optical inspection tool, may be included in the wafer processing apparatus 100. The measuring tool 102 may utilize scatterometry and/or ellipsometry optical techniques. For example, the measuring tool 102 may employ such optical techniques to optically analyze a surface and layers of a wafer provided by patterning tool 104. In one embodiment, the measuring tool 102 creates an x-y-z (3D) representation of a wafer using one or more of the optical techniques of the measuring tool 102. More particularly, the measuring tool 102 may provide CDs associated with features and structures (e.g., transistors or capacitors) defined in the wafer.

The wafer processing apparatus 100 may further comprise a processor 106, which processor performs the processes disclosed herein electronically, and a monitor 108 that may display results of the processes of the processor 106. The processor 106 may be in communication with a memory device 110, such as a semiconductor memory, and a computer software-implemented database system 112 for storage of process information. The processor 106 may also be in communication with an etch and deposition tool 114. The etch and deposition tool 114 may be functional to thin or etch material from a portion of a wafer. In addition, the etch and deposition tool 114 may be functional to thicken material of a portion of a wafer by way of deposition. More particularly, the etch and deposition tool 114 may be used to treat a wafer to remove non-uniformities in a surface of the wafer and to add non-uniformities to a surface of the wafer.

The memory device 110 may comprise an article of manufacture. In one embodiment, the memory device 110 may comprise any non-transitory computer readable medium or machine readable medium, such as an optical, magnetic or semiconductor storage. The storage medium may store various types of computer executable instructions to implement one or more of logic flows described herein. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The embodiments are not limited in this context.

In some embodiments, the wafer processing apparatus 100 of FIG. 1 may be configured to perform one or more processes, techniques, and/or methods as described herein, or portions thereof. One such process is illustrated in FIG. 2, described in detail further below. In conjunction with the process of FIG. 2, FIGS. 3A-3C and FIG. 4 depict details of non-uniform wafer processing according to some embodiments of the disclosure.

Turning now to FIG. 3A there is shown a wafer 300, such as a semiconductor wafer, where a wafer plane 312 of the wafer 300 is represented by the X-Y plane of the Cartesian coordinate system shown, while a perpendicular 314 to the wafer plane 312 of the wafer lies along the Z-axis (Z-direction). In accordance with various embodiments, variations in a critical dimension (CD) of a surface feature 306 along the X-direction or Y-direction in different X-Y locations of the wafer 300, may be compensated for by generating a change in material along the Z-direction in the surface feature 306 as a function of X-Y location. Said differently, instead of preserving the material uniformity of a surface feature 306 along the Z-direction at different X-Y locations, the material uniformity along the Z-direction may be deliberately varied to compensate for changes in CD between different X-Y locations. Examples of material characteristics that may be varied along the Z-direction, include thinning and etching, doping, thickening or deposition, as well as amorphization. In some examples, the height H of a surface feature 306 may be varied as a function of X-Y location in the wafer 300 to compensate for variations in CD along the Y-direction, or X-direction. The height H may be increased by non-uniformly depositing a material at different X-Y locations so as to increase H in some X-Y locations with respect to other X-Y locations, so that a property such as cross-sectional area may be maintained as a constant. Alternatively, the height H may be decreased by non-uniformly etching a material at different X-Y locations so as to decrease H in some X-Y locations with respect to other X-Y locations, so that a property such as cross-sectional area may be maintained as a constant.

As further shown in FIG. 3A a processing apparatus 350 is depicted in schematic form. The processing apparatus 350 represents a processing apparatus for non-uniformly processing a feature such as the surface feature 306 along the Z-direction as a function of X-Y location. The processing apparatus 350 may be a plasma based processing system having a plasma chamber 352 for generating a plasma 356 therein by any convenient method as known in the art. An extraction plate 354 may be provided as shown, having an extraction aperture 358, where a selective area processing (SAP) operation may be implemented using a processing beam 360 to non-uniformly process the surface feature 306 as a function of X-Y location.

During a SAP operation, the processing beam 310, which processing beam 310 may represent etching ions or depositing ions in different implementations, is extracted through the extraction aperture 358 as shown. The processing beam 360 may be extracted when a voltage difference is applied between the plasma chamber 352 and wafer 300 as in known systems. The processing beam 360 may be extracted as a continuous beam or as a pulsed ion beam as in known systems.

By scanning a wafer stage 302 including wafer 300 with respect to the processing beam 360 along the direction 310, parallel to the Y-direction, the processing beam 360 may etch the surface feature 306, deposit onto the surface feature 306, or dope the surface feature 306, in a non-uniform manner. This non-uniform processing may account for initial differences in CD of the surface feature 306 in different regions (X-Y locations) of wafer 300. The CD may be expressed as an X-CD for critical dimension along an X-axis (X-direction), and a Y-CD for critical dimension along a Y-axis (Y-direction). In various embodiments, for example, the processing beam 360 may be provided as a ribbon ion beam having a long axis that extends along the X-direction of the Cartesian coordinate system shown. Thus the wafer plane 312 may lie parallel to the X-Y plane and the X-direction or Y-direction may lie within the wafer plane 312. The processing beam 360, by virtue of the scanning of the wafer 300 along the Y-direction, may non-uniformly process the surface feature 306 along the Y-direction by varying scan speed or by varying ion current of the processing beam 360 as a function of time during the scan.

Turning now to FIG. 3B there is shown a top plan view of one variant of the exemplary operation of FIG. 3A. In this example, the wafer 300 is a circular wafer, such as a silicon wafer, and the processing beam 360 is provided as a ribbon ion beam extending to a beam width along the X-direction, where the beam width WB is adequate to expose an entire width of the wafer 300, even at the widest part along the X-direction. Exemplary beam widths may be in the range of 10 cm, 20 cm, 30 cm, or more while exemplary beam lengths along the Y-direction may be in the range of 3 mm, 5 mm, 10 mm, or 20 mm. The embodiments are not limited in this context.

As also indicated in FIG. 3B, the wafer 300 may be scanned in the scan direction 310, where the scan direction 310 lies in the X-Y plane, such as along the Y-direction. Notably, the scan direction 310 may represent the scanning of wafer 300 in two opposing (180 degrees) directions along the Y-direction, or just a scan toward the left or a scan toward the right. As shown in FIG. 3B, the long axis of processing beam 360 extends along the X-direction, perpendicularly to the scan direction 310. Accordingly, an entirety of the wafer 300 may be exposed to the processing beam 360 when scanning of the wafer 300 takes place along a scan direction 310 to an adequate length from a left side to right side of wafer 300 as shown in FIG. 3B.

As also shown in FIG. 3B, the ion exposure of wafer 300 to the processing beam 360 may take place when the wafer 300 is disposed at a first rotational position as indicated by the position P1 on wafer 300 being located under the location L on the extraction plate 354. For example, the position P1 may correspond to the position of a notch or a flat on a wafer. In accordance with various embodiments, a plurality of exposure cycles may be performed to process a plurality of surface features 306 located at different X-Y locations, where the wafer 300 may be rotated through a plurality of different rotational positions, as noted.

Turning now to FIG. 3C there is shown a top plan view of another instance of an SAP processing of the wafer 300. In the instance depicted in FIG. 3C a difference lies in the rotational position of the wafer 300. In this instance, while the wafer 300 is exposed to the processing beam 360, the wafer 300 is disposed at a second rotational position where the position P2 on wafer 300 is located under the location L on the extraction plate 354. The position P2 may represent a position that lies on a radius of wafer 300 rotated at a given angle, such as 45 degrees with respect to the radius that intercepts the position P1. Accordingly, in FIG. 3C, the wafer 300 has been rotated about a perpendicular to wafer plane 312 (X-Y plane, see FIG. 3A) through a twist angle $\phi$ of 45 degrees with respect to the rotational position of FIG. 3B. Processing of the wafer 300 in this second rotational position may proceed similarly to processing in the rotational position of FIG. 3B, where the wafer 300 is again scanned along the scan direction 310 to expose an entirety of wafer 300 to the processing beam 360 in a second exposure.

In accordance with one particular embodiment, the processes shown in FIG. 3B and FIG. 3C may be extended to a designed number of exposure cycles, where a given exposure cycle entails scanning the processing beam 360 along the direction 310 and a subsequent rotation of wafer 300 to a new rotational position. In some examples, an SAP etch may comprise 4 exposure cycles, 6 exposure cycles, 8 exposure cycles, or more. In a particular embodiment an SAP etch may involve 8 different exposure cycles where the wafer 300 is disposed at 8 different rotational positions, as indicated by P1, P2, P3, P4, P5, P6, P7, and P8. The 8 different rotational positions may be evenly spaced among one another in certain variants, such as spaced at rotational increments of 45 degrees. In some embodiments, the wafer 300 may be rotated in consecutive exposure cycles between adjacent rotational positions, such as from P1 to P2 to P3, and so forth. In other embodiments, in consecutive exposure cycles, other rotational sequences may be performed, such as P1 to P5 to P2 to P6 to P3 to P7 to P4 to P8. The embodiments are not limited in this context.

Notably the scan profile for a given exposure cycle may be tailored according to the non-uniformity in CD of surface features 306 along the scan direction within the wafer 300 during the given exposure cycle. Thus, while the wafer 300 may be scanned with respect to the processing beam 360 along the same absolute direction (Y-axis) in different exposure cycles, the path of the processing beam 360 may correspond to different paths within the surface of the wafer 300 because of the different twist angle $\phi$ of the wafer 100 in different exposure cycles. Moreover, the combination of different scans of the processing beam 360 within an SAP processing operation may be arranged to account for the two dimensional non-uniformity of CD of surface feature 306 along the Y-direction within the X-Y plane. For example, when the wafer 300 is in the rotational position of FIG. 3B, a uniform scan may be performed, wherein scan speed and ion beam current are constant across the scan. When the wafer 300 is disposed in the rotational position of FIG. 3C, a non-uniform scan may be performed, composed of a plurality of scan segments, wherein a first scan speed of a first scan segment differs from a second scan speed of a second scan segment. Alternatively, the scan speed of wafer 300 may be varied in a continuous manner according to a scan profile to generate a non-uniform etch.

Alternatively, a non-uniform scan may be performed by providing the processing beam 360 as a pulsed ion beam and by varying the duty cycle of the pulsed ion beam at different scan segments as the processing beam 360 is scanned with respect to the wafer 300. A full SAP processing operation include any suitable number of exposure cycles, wherein any combination of uniform and non-uniform scanning may be performed to generate a target a non-uniform processing profile for surface features 306 to generate a designed non-uniformity in height H of the surface features 306 as a function of X-Y position. The non-uniformity in height H may generated by such an SAP processing operation may result in a two dimensional non-uniformity in H in different X-Y locations over a wafer surface at the macroscopic level, such as the centimeter or millimeter level. Notably, the CD values for the surface features 306 may be on the order of nanometers or tens of nanometers along the X-direction or Y-direction, while the height H may also have values in the range of nanometers to tens of nanometers. The embodiments are not limited in this context.

According to various embodiments, a map providing a multi-dimensional representation of a feature of the wafer 300 may be obtained before the processing operations of FIGS. 3A-3C. The map may be recorded by known techniques, such as optical techniques, including scatterometry and ellipsometry, where such techniques are capable of generating information such as dimensions of a surface feature at the micrometer or nanometer level, along the X-direction, Y-direction, and Z-direction. At the same time, the microscopic information may be collected across different macroscopic regions of a wafer, such as different die within a semiconductor wafer. Thus, in one example, a two dimensional representation or map may provide CD of the surface feature 306 along the Y-direction as a function of macroscopic position over a wafer surface, that is, over wafer 300, at different X-Y locations, such as different chips or die locations. In another example, a two dimensional map over the surface of wafer 300 may provide at different X-Y locations: the CD along the Y-direction, CD along the X-direction, as well as height along the Z-direction for the surface feature 306. The map may be used to build a three dimensional (3D) model over the wafer for processing the wafer 300 in a non-uniform manner. For example, the 3D model may include a targeted height variation of surface features 306 as a function of X-Y position, to be generated by a non-uniform SAP etch process as generally described above. Accordingly, the 3D model may include a matrix including different values of H to be generated as a function of X,Y coordinate within the wafer 300.

In one implementation where just one CD along a given axis in the X-Y plane is measured, such as along the Y-direction, the height of the surface feature 306 may be assumed to be constant as a function of X,Y location. Accordingly, the different final values of H for surface feature 306 to be generated by an SAP operation may assume that the initial value of H before SAP processing is a single value at all X,Y locations.

Figure 4:
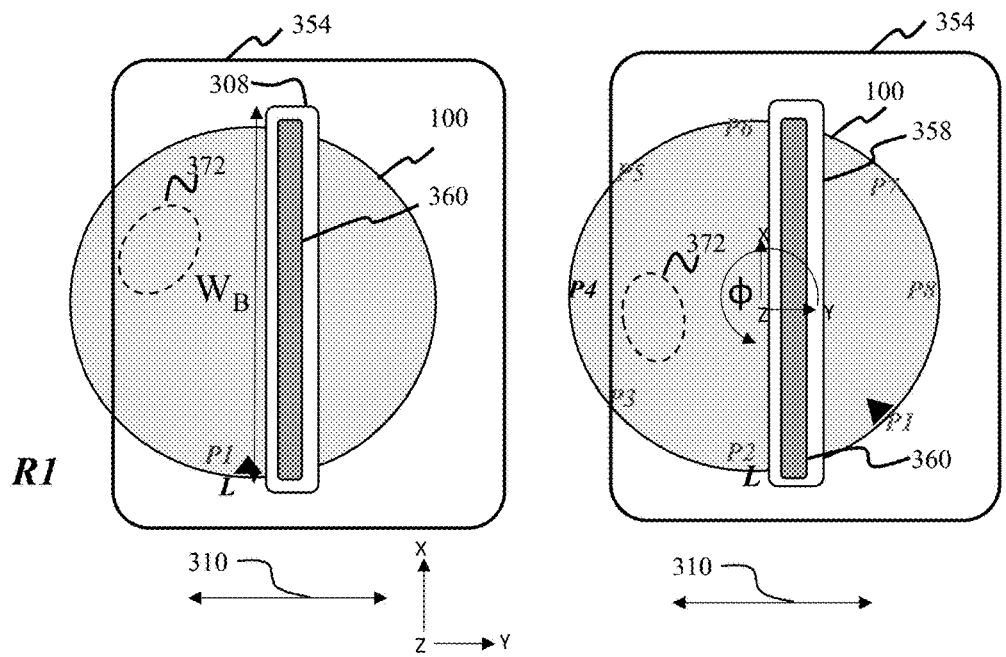
FIG. 4 depicts data as a function of radial position along one radius on a wafer, according to various embodiments of the disclosure.
Figure 4:
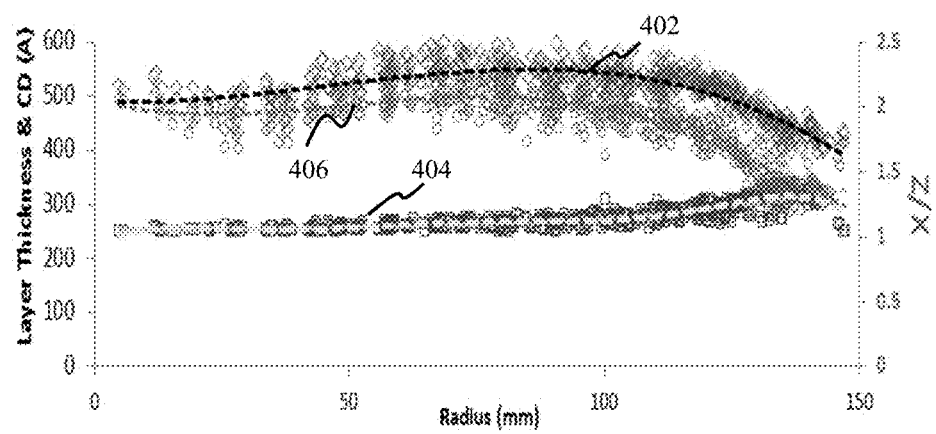

In other implementations where height dimension or other initial dimension of a surface feature along the Z-direction is measured, an SAP operation may take into account the CD variation along the Y-direction, as well as the height variation along the Z-direction for the different X,Y locations. FIG. 4 provides an example of the latter implementation where the depth (along the Z-direction) as well as width (along the X-direction) of metal lines is measured as a function of position across a wafer. The measured data is used to build a 3-D model for processing the wafer in a non-uniform manner. In particular, for clarity of explanation FIG. 4 shows the data as a function of radial position along one radius on a wafer. Notably, similar data may be collected over a two dimensional matrix of X-Y locations on a wafer. As shown in FIG. 4, trench depth (curve 402) increases slightly going from the center of the wafer toward intermediate regions, and decreases substantially toward the periphery of the wafer. At the same time, CD along the X-direction (curve 404) increases slightly going from the center of the wafer toward the periphery, except for the very outer edge, where a slight decrease occurs. To compensate for this non-uniformity, a model may be generated to non-uniformly process metal lines in order to achieve a target characteristic, such as uniform RC delay, which uniformity dictates that the product of CD along X-direction and depth along Z-direction is constant across the wafer. As further shown in FIG. 4, a parameter Z/X (curve 406) is calculated, which parameter decreases substantially toward the periphery of the wafer. The Z/X parameter may be used to control a processing apparatus to non-uniformly etch the metal lines along the Z-direction as a function of X,Y location, such as using an SAP process. As a result, the SAP process may etch a substantially different thickness of metal lines in the center of the wafer as opposed to the edge of the wafer, based upon the CD variation along the X-direction as well as the depth variation along the Z-direction.

The example of FIGS. 3A-3C depicts the use of a scanning type of processing apparatus to non-uniformly modify a surface of a wafer, that is, to modify surface features 306 in a non-uniform manner as a function of X-Y location. Notably, any processing apparatus capable of processing a wafer in a non-uniform manner as a function of X,Y location may be used instead of such scanning processing apparatus. Generally, such other processing may be employed to similar effect to generate a non-uniform Z-direction property such as height of a surface feature, over different X-Y locations, to compensate for a non-uniformity of CD along an X-direction or Y-direction at over the different locations. In embodiment, processing may be employed to generate a non-uniform Z-direction property such as height of a surface feature to compensate for non-uniformity in a Z-direction.

Returning now to FIG. 2, block 202 includes analyzing a wafer (wafer) surface using optical techniques to provide a 3D model of at least a portion of a wafer. The analyzing may be performed by optical analysis techniques associated with an optical measuring tool. In one implementation, the 3D model shows feature non-uniformities of the wafer surface in X and Y directions. Furthermore, the 3D model may show features defined in the wafer, such as features defined in the z direction. Such features exhibit characteristics, such as width of a single feature line, spacing between two adjacent features, angle of slope of sidewalls of features, height of features, and the like. The features may be regular product features, such as features used in semiconductor devices, such as gate electrodes of field effect transistors, capacitor structures, dummy gates, or the features may be formed on one or more specified positions, for example, in scribe lines separating individual chip areas. In one embodiment, the 3D model is provided by the wafer processing apparatus, thus negating the need to execute the analyzing of block 202.

Block 204 includes using the 3D model of a wafer, which model includes at least a 3D modeling of a surface and/or layers of the wafer, to modify a surface and/or layers associated with the surface. In one implementation, modifying the surface and/or layers associated with the surface includes etching the surface and/or layers and/or deposition of material on the surface of the wafer. In one embodiment, the modifying process provides a wafer having a non-uniform surface, where the non-uniform surface of the wafer is a modified version of a former non-uniform surface of the wafer.

In an example use of the process, features of a wafer include capacitor features of capacitors defined in the wafer. For example, features of the capacitors may have varying heights in the Z-direction as a result of non-uniformities in a surface of the wafer. The same capacitor features may have varying CDs in the X and Y directions. In one implementation, the surface of the wafer is etched and/or material is added to the surface in the Z direction of the wafer based on capacitor feature variations in CDs in the X and Y directions. In another implementation, the surface of the wafer is etched and/or material is added to the surface in the Z direction of the wafer based on capacitor feature variations in CDs in the Z direction.

In another example use of the process, features of the wafer include transistor features of transistors defined in the wafer. For example, features of transistors may have gates of varying heights in the X direction as a result of non-uniformities in a surface of the wafer. The transistor gates may have varying CDs in the X and Y directions. In one implementation, the surface of the wafer is etched and/or material is added to the surface in the Z direction of the wafer based on transistor gate variations in CDs in the X and Y directions. In another implementation, the surface of the wafer is etched and/or material is added to the surface in the Z direction of the wafer based on transistor gate variations in CDs in the Z direction.

In another example use of the process, a surface of the wafer is etched and/or material is added to the surface in the Z direction of the wafer prior to CD analysis of the wafer. For example, the wafer is etched and/or material is added to the surface in the Z direction of the wafer based on CD analysis of another wafer.

In another example use of the process, features of the wafer include dummy gates defined in the wafer. The dummy gates may have varying heights in the Z direction as a result of non-uniformities in a surface of the wafer. The dummy gates may have varying CDs in the X and Y directions. In one implementation, the surface of the wafer is etched and/or material is added to the surface in the Z direction of the wafer based on dummy gate variations in CDs in the X and Y directions. In another implementation, the surface of the wafer is etched and/or material is added to the surface in the Z direction of the wafer based on dummy gate variations in CDs in the Z direction.

In one embodiment, one or more changes made in the Z direction of a wafer surface, based on variations in CDs in the X and Y directions, are used to modify a surface of another wafer before CD analysis of the another wafer. In another embodiment, one or more changes made in the Z direction of a wafer surface, based on variations in CDs in the X and Y directions, are used to modify a surface of another wafer. Therefore, CD analysis of the another wafer may not be necessary.

An advantage afforded by the present embodiments includes increasing device yield through accounting for variations in critical dimension of device features at different X-Y locations using non-uniform processing that compensates for such variations. Another advantage is that non-uniform processing may be performed on a given wafer used to generate a non-uniform CD map or model, so the non-uniformities in CD already introduced into the given wafer by prior processing may be adjusted for to generate uniform device properties across the wafer.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, yet those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. An apparatus of a wafer processing apparatus, comprising:
    at least one memory; and
    logic, at least a portion of which is implemented in circuitry of the wafer processing apparatus comprising at least one processor coupled to the at least one memory, the logic to:
        provide a 3D model of a surface of a wafer, the wafer defining a wafer plane; and
        modify just a height of a surface feature in a Z-direction along the surface of the wafer based on at least one of: an X-critical dimension (CD), extending along an X-direction of the wafer plane, and a Y-CD extending along a Y direction of the wafer plane.

2. The apparatus of the wafer processing apparatus according to claim 1, wherein the logic is to provide the 3D model of the surface associated of the wafer using scatterometry or ellipsometry.

3. The apparatus of the wafer processing apparatus according to claim 1, wherein the logic is to modify a height of the surface feature in the Z direction by etching material from the surface feature or by adding material to the surface feature by deposition.

4. The apparatus of the wafer processing apparatus according to claim 1, wherein the X-CD and the Y-CD are associated with one or more capacitors defined in the wafer.

5. The apparatus of the wafer processing apparatus according to claim 1, wherein the X-CD and the Y-CD are associated with one or more transistors defined in the wafer.

6. The apparatus of the wafer processing apparatus according to claim 1, wherein the X-CD and the Y-CD are associated with one or more transistor gates defined in the wafer.

7. The apparatus of the wafer processing apparatus according to claim 1, wherein the X-CD and the Y-CD are associated with one or more dummy gates defined in the wafer.

8. The apparatus of the wafer processing apparatus according to claim 1, wherein the logic is to:
    generate a map of the Y-CD of as a function of X,Y location across the wafer, the map comprising a non-uniformity in Y-CD as a function of X,Y location;
    calculate a property map comprising a value of the height for the surface feature along the Z direction as a function of the X,Y location to compensate for the non-uniformity in Y-CD; and
    send instructions to the wafer processing apparatus to change the height of the surface feature according to the property map, wherein the height of the surface feature is different than a second height of an adjacent surface feature located in a different X-Y location, and wherein the height of the surface feature is modified to maintain a constant cross-sectional area across at least a portion of the wafer.

9. The apparatus of the wafer processing apparatus, of claim 1, wherein the logic is to:
    modify the height of the surface feature in the Z-direction along the surface of the wafer, based additionally on an initial dimension of the surface feature along the Z-direction.

* * * * *